(12) United States Patent
Chen et al.

(10) Patent No.: US 11,164,860 B2
(45) Date of Patent: Nov. 2, 2021

(54) ELECTROSTATIC DISCHARGE PROTECTION CIRCUIT AND ELECTRONIC DEVICE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Guang Chen, Shanghai (CN); Jie Chen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 18 days.

(21) Appl. No.: 16/815,344

(22) Filed: Mar. 11, 2020

(65) Prior Publication Data
US 2020/0294994 A1  Sep. 17, 2020

(30) Foreign Application Priority Data
Mar. 14, 2019 (CN) .......................... 201910193322.5

(51) Int. Cl.
*H01L 27/02* (2006.01)
*H01L 27/092* (2006.01)
(Continued)

(52) U.S. Cl.
CPC ...... *H01L 27/0277* (2013.01); *H01L 27/0288* (2013.01); *H01L 27/092* (2013.01); *H02H 9/046* (2013.01); *H03K 17/08104* (2013.01)

(58) Field of Classification Search
CPC ............. H01L 27/0248; H01L 27/0262; H01L 27/0274; H01L 27/0277; H01L 27/092;
(Continued)

(56) References Cited

U.S. PATENT DOCUMENTS

5,982,601 A * 11/1999 Lin ..................... H01L 27/0262
                                                                361/111
6,233,130 B1 * 5/2001 Lin ..................... H01L 27/0251
                                                                361/111
(Continued)

*Primary Examiner* — Sisay G Tiku
(74) *Attorney, Agent, or Firm* — Anova Law Group, PLLC (57) ABSTRACT

An electrostatic discharge protection circuit and a semiconductor device are provided. The circuit includes: a power source terminal, a ground terminal, and a discharge path. The discharge path includes a clamp transistor and a MOS transistor connected in series and integrated into a same semiconductor substrate with different types. For the MOS transistor, a gate electrode is electrically connected to a substrate terminal; a first electrode is one of a source electrode and a drain electrode; a second electrode is another one of the source electrode and the drain electrode; the first electrode is electrically connected to a gate electrode of the clamp transistor; and the second electrode is electrically connected to the ground terminal. When an electrostatic discharge occurs, the MOS transistor is turned on to form parasitic current between a substrate terminal of the clamp transistor and the second electrode of the MOS transistor.

11 Claims, 8 Drawing Sheets

(51) Int. Cl.
*H02H 9/04* (2006.01)
*H03K 17/081* (2006.01)

(58) Field of Classification Search
CPC .............. H01L 27/0924; H02H 9/046; H03K 17/08104; H03K 17/08108
See application file for complete search history.

(56) References Cited

U.S. PATENT DOCUMENTS

| | | | |
|---|---|---|---|
| 6,304,127 B1 * | 10/2001 | Lin | H01L 27/0251 327/321 |
| 6,465,848 B2 * | 10/2002 | Ker | H01L 27/0251 257/335 |
| 6,552,886 B1 | 4/2003 | Wu et al. | |
| 6,690,561 B2 * | 2/2004 | Hung | H02H 9/046 361/111 |
| 6,919,602 B2 * | 7/2005 | Lin | H01L 27/0266 257/355 |
| 6,958,896 B2 * | 10/2005 | Lin | H01L 27/0274 361/56 |
| 7,518,845 B2 * | 4/2009 | Gauthier, Jr. | H02H 9/046 361/56 |
| 7,606,013 B2 * | 10/2009 | Ellis-Monaghan | H02H 9/046 361/111 |
| 7,738,222 B2 * | 6/2010 | Deutschmann | H01L 27/0262 361/56 |
| 7,782,580 B2 * | 8/2010 | Gauthier, Jr. | H01L 27/0285 361/56 |
| 8,010,927 B2 * | 8/2011 | Gauthier, Jr. | H01L 27/0285 716/120 |
| 9,825,022 B2 * | 11/2017 | Chen | H01L 27/0285 |
| 2014/0286085 A1 * | 9/2014 | Miyakawa | G11C 5/147 365/158 |
| 2015/0262992 A1 * | 9/2015 | Chen | H01L 27/0255 257/140 |
| 2015/0288173 A1 * | 10/2015 | Chen | H02H 9/046 361/56 |
| 2017/0053905 A1 * | 2/2017 | Cline | H01L 27/0262 |
| 2019/0319453 A1 * | 10/2019 | Sithanandam | H01L 27/0288 |

* cited by examiner

ELECTROSTATIC DISCHARGE PROTECTION CIRCUIT AND ELECTRONIC DEVICE THEREOF

CROSS-REFERENCES TO RELATED APPLICATION

This application claims the priority of Chinese Patent Application No. 201910193322.5, filed on Mar. 14, 2019, the content of which is incorporated herein by reference in its entirety.

TECHNICAL FIELD

The present disclosure generally relates to the field of semiconductor technologies and, more particularly, relates to an electrostatic discharge protection circuit and an electronic device.

BACKGROUND

As semiconductor fabrication technologies develop rapidly, devices with ultra-thin gate oxidation layers and thin dielectrics increase. Electrostatic discharge (ESD) gradually becomes one of main reasons for chip failure. For example, for a fin field-effect transistor (FinFET), an ESD protection circuit in a chip is indispensable for a large leakage problem of a multi-fin structure.

A clamp circuit including a clamp transistor is used as the ESD protection circuit in current technologies. The ESD protection circuit is an active circuit that drives an N-type clamping transistor through a gate, and the clamping transistor is coupled between the power supply terminal and the ground terminal, for protecting a core device.

However, electrostatic protection circuits formed by current technologies have limitations and poor performance. Therefore, there is a need to provide an electrostatic protection circuit with improved performance and its fabrication method.

SUMMARY

One aspect of the present disclosure provides an electrostatic discharge protection circuit. The circuit includes: a power source terminal, a ground terminal, and a discharge path. The discharge path includes a clamp transistor and a MOS transistor connected in series. The clamp transistor and the MOS transistor are integrated into a same semiconductor substrate, and have different types. For the MOS transistor, a gate electrode is electrically connected to a substrate terminal; a first electrode is one of a source electrode and a drain electrode; and a second electrode is another one of the source electrode and the drain electrode. For the MOS transistor, the first electrode is electrically connected to a gate electrode of the clamp transistor, and the second electrode is electrically connected to the ground terminal. When an electrostatic discharge occurs, the MOS transistor is turned on to form parasitic current between a substrate terminal of the clamp transistor and the second electrode of the MOS transistor.

Another aspect of the present disclosure provides an electronic device. The electronic device includes an electrostatic discharge protection circuit and a semiconductor device to be protected. The electrostatic discharge protection circuit includes a power source terminal, a ground terminal, and a discharge path. The discharge path includes a clamp transistor and a MOS transistor connected in series. The clamp transistor and the MOS transistor are integrated into a same semiconductor substrate, and have different types. For the MOS transistor, a gate electrode is electrically connected to a substrate terminal; a first electrode is one of a source electrode and a drain electrode; and a second electrode is another one of the source electrode and the drain electrode. For the MOS transistor, the first electrode is electrically connected to a gate electrode of the clamp transistor, and the second electrode is electrically connected to the ground terminal. When an electrostatic discharge occurs, the MOS transistor is turned on to form parasitic current between a substrate terminal of the clamp transistor and the second electrode of the MOS transistor.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

When forming an ESD protection circuit with a clamping transistor, a gate usually drives an active circuit including an N-type clamping transistor coupled between a power supply terminal and a ground terminal, to protect a core device.

Figure 1:
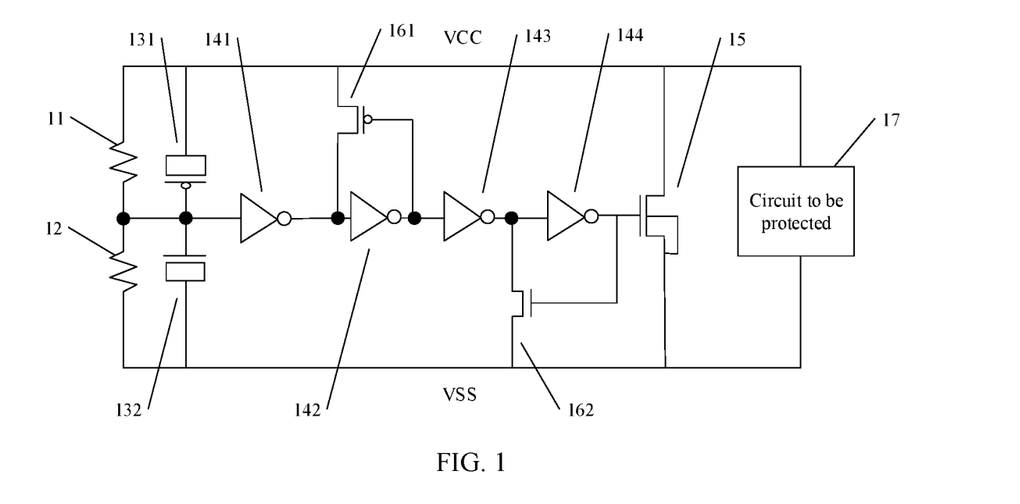
FIG. 1 illustrates an ESD protection circuit.

FIG. 1 illustrates an ESD protection circuit. The ESD protection circuit protects a circuit to be protected 17, and further includes: a power source terminal, a ground terminal, a discharge path, a first resistor 11, a second resistor 12, a voltage divider 131, a voltage divider 132, a first inverter 141, a second inverter 142, a third inverter 143, and a fourth inverter 144. The discharge path includes a clamp transistor 15. The clamp transistor 15 is an N-type transistor. For the clamp transistor 15, a source electrode is electrically connected to the power source terminal, a drain electrode is electrically connected to the ground terminal, and a substrate electrode is connected to the source electrode.

A first terminal of the first resistor 11 is electrically connected to the power source terminal. A first terminal of the second resistor 12 is electrically connected to a second terminal of the first resistor 11, and a second terminal of the second resistor is electrically connected to the ground terminal.

The voltage divider 131 and 132 are connected in series. A first terminal of the voltage divider 131 is electrically connected to the power source terminal, and a second terminal of the voltage divider 132 is electrically connected to the ground terminal.

The first inverter 141, the second inverter 142, the third inverter 143, and the fourth inverter 144, are connected in series. An input terminal of the first inverter is electrically connected to a point between the first resistor 11 and the second resistor 12, and also connected to a point between the voltage divider 131 and 132. An output terminal of the fourth inverter is electrically connected to a gate of the N-type clamp transistor.

The voltage divider 131 and the voltage divider 132 produce a sense voltage of the first inverter 141. The sense voltage usually is far smaller than a switching threshold Vt of the first inverter 141.

The second inverter 142 and a feedback transistor 161 are connected in parallel, and the fourth inverter 144 and a feedback transistor 162 are connected in parallel. When a voltage difference between the feedback transistor 161 and the power source terminal, or a voltage difference between the feedback transistor 162 and the ground terminal, reaches a turn-on voltage, the feedback transistor 161 or the feedback transistor 162 is turned on correspondingly, to adjust the voltage inputted to each inverter.

When ESD happens, the sense voltage rises above the switching threshold, and the first inverter 141 is switched. Correspondingly, through the inverters connected in series, the gate of the clamp transistor 15 is triggered to have a high voltage level, to turn on the clamp transistor 15. ESD currents are diverted from the power source terminal to the ground terminal.

In this ESD protection device, for the clamp transistor 15 in the ESD protection circuit, the source electrode is connected to the power source terminal, and the drain electrode is connected to the ground terminal. Leakage currents from the source electrode to the drain electrode (such as gate-induced drain leakage current, GIDL) occurs easily.

The present disclosure provides an ESD protection circuit. The ESD protection circuit may include: a power source terminal, a ground terminal, and a discharge path. The discharge path may include a clamp transistor and a MOS transistor connected in series. The clamp transistor and the MOS transistor may be integrated into a same semiconductor substrate and have different types. For the clamp transistor, a source electrode and a drain electrode may be electrically connected to a substrate terminal, and to the power source terminal. For the MOS transistor, a gate may be electrically connected to the substrate terminal. For the MOS transistor, a first electrode may be one of the source electrode and the drain electrode, while a second electrode may be another one of the source electrode and the drain electrode. The first electrode of the MOS transistor may be electrically connected to a gate of the clamp transistor, and the second electrode of the MOS transistor may be electrically connected to the ground terminal. When ESD occurs, the MOS transistor may be turned on, parasitic current may be formed between the substrate terminal of the clamp transistor and the second electrode of the MOS transistor. In an ESD protection circuit formed by current technologies, a source electrode and a drain electrode of a clamp transistor are connected to VCC and VSS respectively, so the leakage current occurs easily. Instead, in the present disclosure, the ESD protection circuit may include the clamp transistor, and the source electrode, the drain electrode, and the substrate terminal of the clamp transistor may be electrically connected, and may form a capacitor structure with the gate. Correspondingly, when ESD does not happen, a leakage current in the discharge path and influence on the performance of the core device may be avoided effectively. The clamp transistor and the MOS transistor connected in series may form a silicon-controlled-rectifier structure. When ESD occurs, the MOS transistor may be turned on, and the parasitic current may be formed between the substrate terminal of the clamp transistor and the second electrode of the MOS transistor. Correspondingly, ESD current may be discharged and the core device may be protected.

Figure 2:
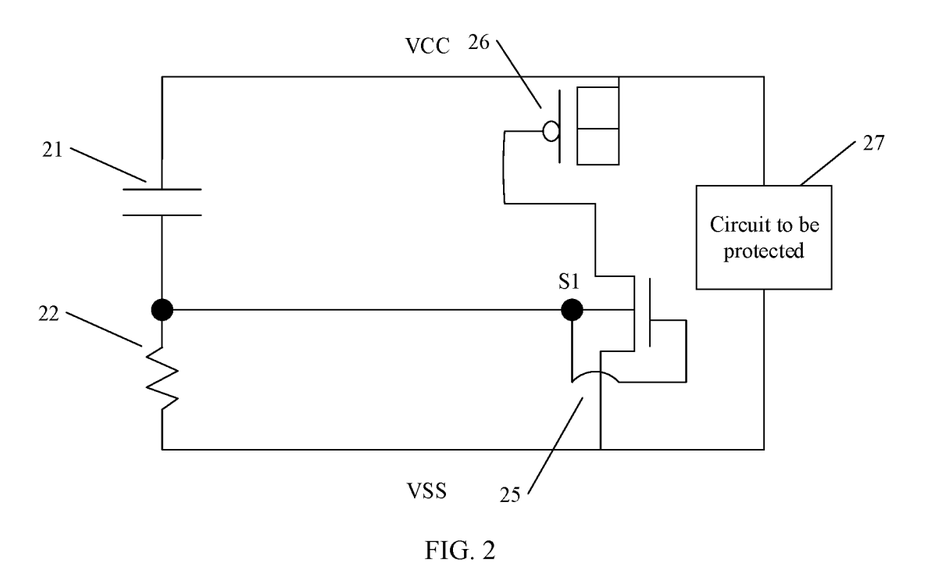
FIG. 2 illustrates an ESD protection circuit consistent with various embodiments of the present disclosure.

The present disclosure provides an ESD protection circuit. As illustrated in FIG. 2, the ESD protection circuit may protect the circuit to be protected 27, and may further include: a power source terminal VCC, a ground terminal VSS, and a discharge path.

The discharge path may include a clamp transistor 26 and a MOS transistor 25 connected in series. The clamp transistor 26 and the MOS transistor 25 may be integrated into a same semiconductor substrate and may have different types.

For the clamp transistor, a source electrode and a drain electrode may be electrically connected to a substrate terminal, and to the power source terminal.

For the MOS transistor 25, a gate may be electrically connected to the substrate terminal.

For the MOS transistor 25, a first electrode may be one of the source electrode and the drain electrode, while a second electrode may be another one of the source electrode and the drain electrode. The first electrode of the MOS transistor 25 may be electrically connected to a gate of the clamp transistor 26, and the second electrode of the MOS transistor may be electrically connected to the ground terminal. When ESD occurs, the MOS transistor 25 may be turned on, parasitic current may be formed between the substrate terminal of the clamp transistor 26 and the second electrode.

In one embodiment, the ESD protection circuit may protect a Fin Field Effect Transistor (FinFET).

A FinFET is a new complementary-metal-on-semiconductor transistor, and may include fins protruding from a surface of the semiconductor substrate, gate structures covering a portion of tops and sidewalls of the fins, source doped regions and drain doped regions in the fins at sides of each gate structure. The FinFET has three-dimensional gate structures and can be damaged easily by the ESD, and the leakage current can happen more easily when using an ESD protection circuit formed by the current technologies.

In the present disclosure, the ESD protection circuit may protect the FinFET. Correspondingly, in the three-dimensional gate structures of the FinFET, coupling capacitors may be formed easily between the substrate (connected to the source electrode and the drain electrode) and the gate to reduce the leakage current and improve quality of the FinFET.

In one embodiment, the clamp transistor 26 may be a PMOS transistor, and the MOS transistor 25 may be an NMOS transistor. Correspondingly, for the MOS transistor 25, the first electrode may be the drain electrode, and the second electrode may be the source electrode.

In another embodiment, the clamp transistor 26 may be an NMOS transistor, and the MOS transistor 25 may be a PMOS transistor. Correspondingly, for the MOS transistor 25, the first electrode may be the source electrode, and the second electrode may be the drain electrode.

In the present disclosure, the clamp transistor 26 may be a PMOS transistor, and the MOS transistor 25 may be an NMOS transistor. Correspondingly, major carriers may be electrons, and the discharge efficiency of the ESD current may be improved.

The ESD protection circuit may further include a first capacitor 21 and a first resistor 22.

A first terminal of the first capacitor 21 may be electrically connected to the power source terminal VCC. For the first resistor 22, a first terminal may be electrically connected to a second terminal of the first capacitor 21, and a second terminal may be electrically connected to the ground terminal VSS.

The second terminal of the first capacitor 21 may be electrically connected to the substrate terminal S1 of the MOS transistor.

When the ESD happens, the first capacitor 21 and the first resistor 22 may trigger the substrate terminal S1 of the MOS transistor 25 to be high voltage, to turn on the MOS transistor and form parasitic current to discharge the ESD current.

In one embodiment, the first capacitor 21 may be a gate oxide parasitical capacitance of the source electrode/drain electrode connected transistor.

In one embodiment, the first resistor 22 may be one of a non-silicide poly resistor, a gate soft tie high NMOS resistor, a gate soft tie low PMOS resistor, a metal resistor, and a high-K resistor.

In the present disclosure, the first capacitor 21 and the first resistor 22 may be used to achieve a suitable time constant (R-C time constant) to sense an ESD pulse, to trigger the substrate terminal S1 of the MOS transistor 25 to be a high voltage. The R-C time constant may be larger than a width of the ESD pulse and smaller than a power-on rise-up time.

In the present disclosure as illustrated in FIG. 2, the clamp transistor 26 and the MOS transistor connected in series may form a thyristor structure. When the MOS transistor 25 is turned on, the clamp transistor 26 may be turned on too, and the parasitic current may be formed between the substrate terminal of the clamp transistor 26 and the second electrode of the MOS transistor 25. When the MOS transistor is an NMOS transistor, the second electrode may be the source electrode of the NMOS transistor.

Figure 3:
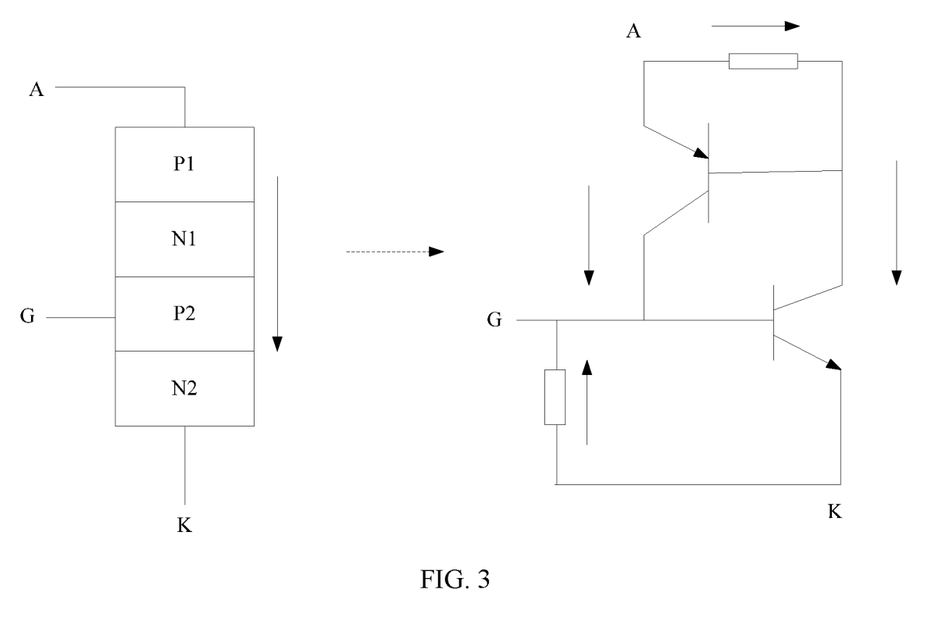
FIG. 3 illustrates a circuit structure of a thyristor consistent with various embodiments of the present disclosure.

FIG. 3 illustrates a circuit structure of a thyristor consistent with various embodiments of the present disclosure.

The thyristor may have a PNPN four-semiconductor-layer structure, as illustrated by P1, N1, P2, and N2 four layers in FIG. 3. The thyristor may further have three electrodes including an anode A, a cathode K and a control electrode G. When the thyristor operates, the cathode A and the cathode K may be connected to the power source and a load respectively to form a main circuit of the thyristor, while the control electrode G and the cathode K may be connected to an instrument controlling the thyristor to form a control circuit of the thyristor.

In the present disclosure, the clamp transistor and the MOS transistor may form two mutually overlapped transistor circuits. When sufficient current flows in, a strong positive feedback may be formed, and two transistors may be saturated and turned on. The parasitic current may be formed in the direction of P1-N1-P2-N2.

Figure 4:
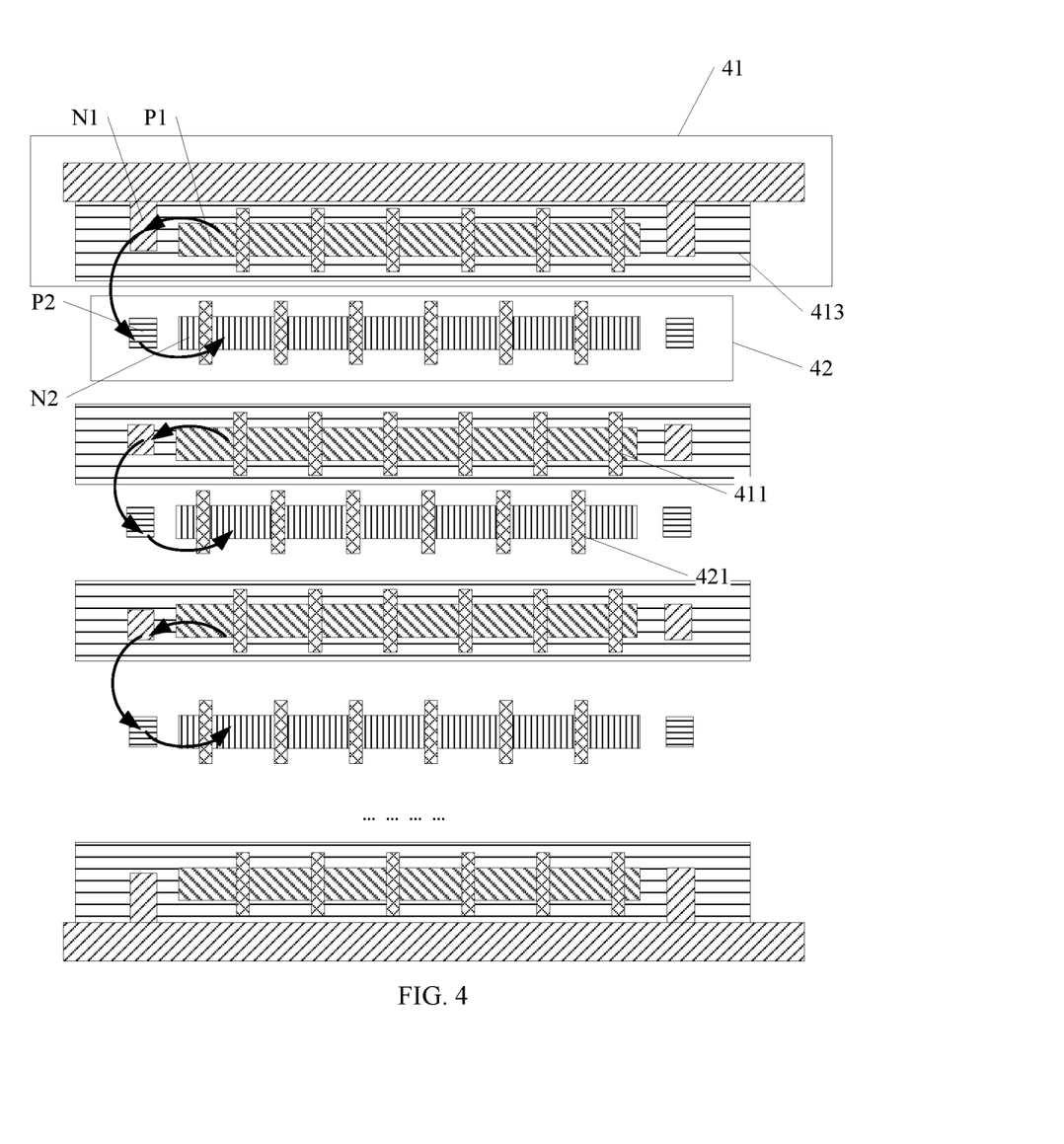
FIG. 4 illustrates a discharge path of an ESD protection circuit consistent with various embodiments of the present disclosure.
Figure 5:
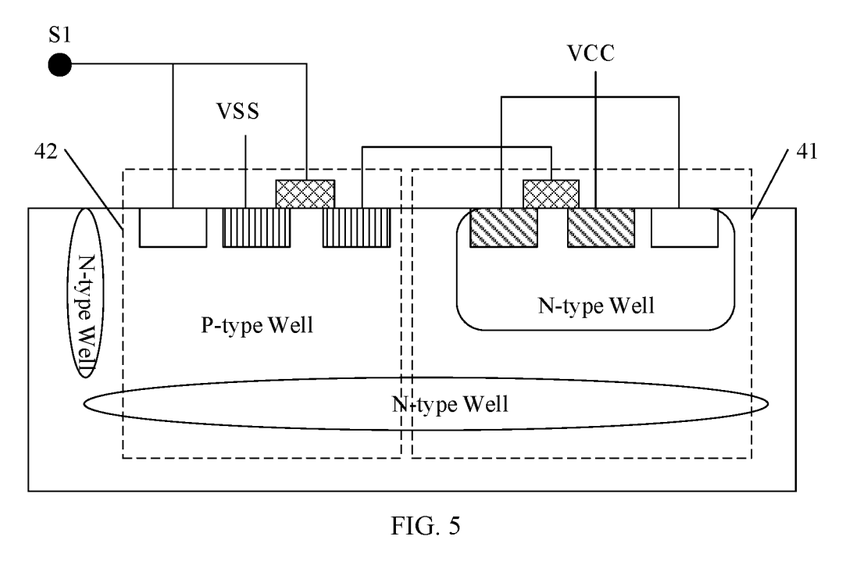
FIG. 5 illustrates a cross-section view of a discharge path of an ESD protection circuit consistent with various embodiments of the present disclosure.

FIG. 4 illustrates a discharge path of an ESD protection circuit consistent with various embodiments of the present disclosure; and FIG. 5 illustrates a cross-section view of a discharge path of an ESD protection circuit consistent with various embodiments of the present disclosure. A semiconductor device of the ESD protection circuit may include a plurality of clamp transistors 41 (corresponding to the clamp transistor 26 in FIG. 2) and a plurality of MOS transistor 42 (corresponding to the MOS transistor 25 in FIG. 2).

The discharge path may include the plurality of clamp transistors 41 and the plurality of MOS transistors 42. The plurality of clamp transistors 41 and the plurality of MOS transistors 42 may be integrated into a same semiconductor substrate. FIG. 5 illustrates a cross-section view of a clamp transistor 41 and a MOS transistors 42 integrated into a same semiconductor substrate of the ESD protection circuit.

In each clamp transistor and a corresponding MOS transistor, the parasitic current may be formed from a source electrode/drain electrode doped region P1 of the clamp transistor 41, a substrate N1 of the clamp transistor 41, a substrate P2 of the MOS transistor 42, to a source electrode/drain electrode doped region N2 of the MOS transistor 42. At least a portion of N1 and P1 may be located in an N-type well 413. As illustrated in FIG. 5, the clamp transistor 41 may be a PMOS transistor, and the MOS transistor 42 may be an NMOS transistor. When the substrate terminal S1 of the MOS transistor 42 is triggered to be a high voltage, the clamp transistor 41 and the MOS transistor 42 may be turned on.

Gate structures of the plurality of clamp transistors 41 and the plurality of MOS transistors 42 may be disposed on the surface of the semiconductor substrate alternately.

As illustrated in FIG. 4, the plurality of clamp transistors 41 may include gate structures 411, and the plurality of MOS transistors 42 may include gate structures 421. The gate structures of the plurality of clamp transistors 41 and the plurality of MOS transistors 42 may be disposed on the surface of the semiconductor substrate alternately. Extending directions of the gate structures 411 and extending directions of the gate structures 421 may be parallel to each other and may not be in a same line.

In one embodiment, the gate structures of the plurality of transistors may be arranged neatly to reduce difficulty and process complexity of layout development.

In one embodiment, the gate structures 411 of the plurality of clamp transistors 41 and the gate structures 421 of the plurality of MOS transistors 42 may be disposed on the surface of the semiconductor substrate alternately, to improve heat dissipation of the plurality of clamp transistors 41 and the plurality of MOS transistors 42. A heat dissipation uniformity may be improved.

In the present disclosure, the ESD protection circuit may include the clamp transistor 26, and the source electrode, the drain electrode and the substrate terminal of the clamp transistor 26 may be electrically connected to form the capacitor structure with the gate. In an ESD protection circuit formed by current technologies, a source electrode and a drain electrode of a clamp transistor are connected to VCC and VSS respectively, so the leakage current occurs easily. In comparison with an ESD protection circuit formed by current technologies, in the present disclosure, the ESD protection circuit may include the clamp transistor, and the source electrode, the drain electrode, and the substrate terminal of the clamp transistor may be electrically connected, and may form a capacitor structure with the gate. Correspondingly, when ESD does not happen, a leakage current in the discharge path and influence on the performance of the core device may be avoided effectively. The clamp transistor 26 and the MOS transistor 25 connected in series may form a thyristor structure. When ESD occurs, the MOS transistor 25 may be turned on, and the parasitic current may be formed between the substrate terminal of the clamp transistor 26 and the second electrode of the MOS transistor 25. Correspondingly, ESD current may be discharged and the core device may be protected.

Figure 6:
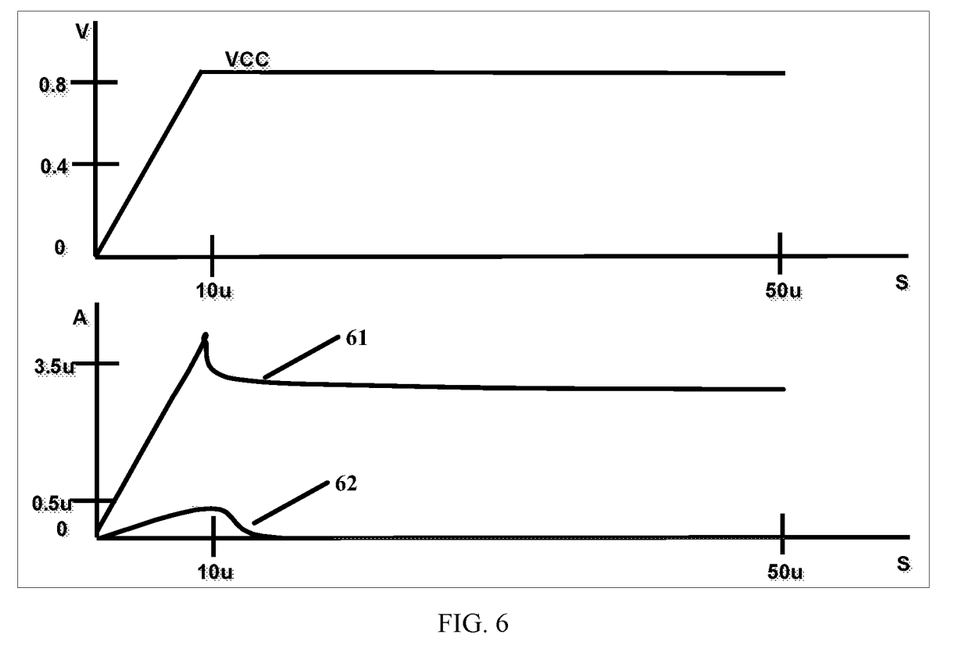
FIG. 6 illustrates a leakage current curve of a discharge path of an ESD protection circuit consistent with various embodiments of the present disclosure.

FIG. 6 illustrates a leakage current curve 62 of a discharge path of the ESD protection circuit provided by one embodiment of the present disclosure. A leakage current curve 61 of an ESD protection circuit formed by current technologies is also shown in FIG. 6 for comparison. As illustrated in FIG. 6, in comparison with the leakage current curve 61 of an ESD protection circuit formed by current technologies, the leakage current curve 62 of a discharge path of the ESD protection circuit provided by one embodiment of the present disclosure may have a lower leakage current, and quality of the core device may be improved.

In one embodiment, the ESD protection circuit may further include a diode. A first terminal of the diode may be connected between the resistor and the capacitor, and a second terminal of the diode may be connected to the ground terminal. Correspondingly, the MOS transistor may also be turned on when the reverse ESD happens, to form the parasitic current to reversely discharge the ESD current and protect the core device.

Figure 7:
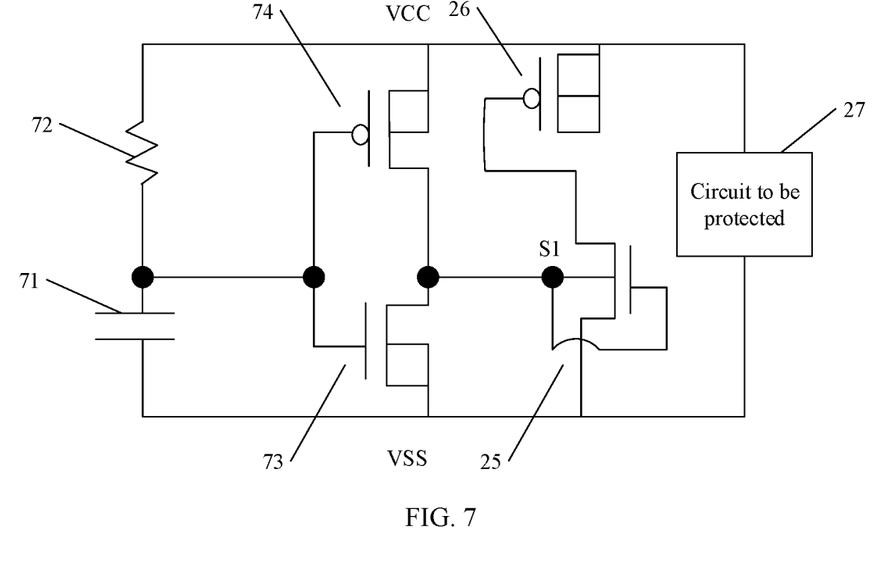
FIG. 7 illustrates another ESD protection circuit consistent with various embodiments of the present disclosure.

Another embodiment of the present disclosure also provides another ESD protection circuit illustrated in FIG. 7. The ESD protection circuit may protect a circuit to be protected 27. The ESD protection circuit may include a power source terminal VCC, a ground terminal VSS, and a discharge path.

The discharge path may include a clamp transistor 26 and a MOS transistor 25 connected in series. The clamp transistor 26 and the MOS transistor 25 may be integrated into a same semiconductor substrate and may have different types.

For the clamp transistor 26, a source electrode and a drain electrode may be electrically connected to a substrate terminal, and to the power source terminal.

For the MOS transistor 25, a gate may be electrically connected to the substrate terminal.

For the MOS transistor 25, a first electrode may be one of the source electrode and the drain electrode, while a second electrode may be another one of the source electrode and the drain electrode. The first electrode of the MOS transistor 25 may be electrically connected to a gate of the clamp transistor 26, and the second electrode of the MOS transistor may be electrically connected to the ground terminal. When ESD occurs, the MOS transistor 25 may be turned on, parasitic current may be formed between the substrate terminal of the clamp transistor 26 and the second electrode of the MOS transistor 25.

In one embodiment, the clamp transistor 26 may be a PMOS transistor, and the MOS transistor 25 may be an NMOS transistor. Correspondingly, for the MOS transistor 25, the first electrode may be the drain electrode, and the second electrode may be the source electrode.

The ESD protection circuit may further include a second resistor 72, a second capacitor 71, and one or more inverters connected in series.

A first terminal of the second resistor 72 may be connected to the power source terminal. A first terminal of the second capacitor 71 may be connected to a second terminal of the second resistor 72, and a second terminal of the second capacitor 71 may be connected to the ground terminal.

For the one or more inverters connected in series, an input terminal of a first inverter may be connected between the second resistor and the second capacitor, while an output terminal of a last inverter may be connected to the substrate terminal S1 of the MOS transistor 25. A number of the one or more inverters connected in series may be singular.

When the ESD happens, the second capacitor 71, the second resistor 72, and the one or more inverters may trigger the substrate terminal S1 of the MOS transistor 25 to be high voltage, to turn on the MOS transistor 25 and form parasitic current to discharge the ESD current.

In the present disclosure, when the ESD happens, the second capacitor 71, the second resistor 72, and the one or more inverters connected in series may trigger the substrate terminal S1 of the MOS transistor 25 to be high voltage, to turn on the MOS transistor 25 and form parasitic current to discharge the ESD current.

In one embodiment, the second capacitor 71 may be a gate oxide parasitical capacitance of a transistor where In one embodiment, the first capacitor 21 may be a gate oxide parasitical capacitance of a transistor where the source electrode and the drain electrode are connected.

In one embodiment, the second resistor 72 may be one of a non-silicide poly resistor, a gate soft tie high NMOS resistor, a gate soft tie low PMOS resistor, a metal resistor, and a high-K resistor.

In the present disclosure as illustrated in FIG. 7, the clamp transistor 26 and the MOS transistor connected in series may form a thyristor structure. When the MOS transistor 25 is turned on, the clamp transistor 26 may be turned on too, and the parasitic current may be formed between the substrate terminal of the clamp transistor 26 and the second electrode of the MOS transistor 25.

For description purposes only, the embodiment where the ESD protection circuit includes one inverter will be used as an example to illustrate the present disclosure, and should not limit the scopes of the present disclosure. As illustrated in FIG. 7, the inverter may include a P-type transistor 74 and an N-type transistor 73. A gate of the P-type transistor 74 may be electrically connected to a gate of the N-type transistor 73. A source electrode of the P-type transistor 74 may be electrically connected to the power source terminal, and a source electrode of the N-type transistor 73 may be electrically connected to the ground terminal. A drain electrode of the P-type transistor 74 may be electrically connected to a drain electrode of the N-type transistor 73. A first terminal of the inverter may be located between the gate of the P-type transistor 74 and the gate of the N-type transistor 73. A second terminal of the inverter may be located between the drain electrode of the P-type transistor 74 and the drain electrode of the N-type transistor 73.

In some embodiments of the present disclosure, the number of the one or more inverters may be reduced. For example, the ESD protection circuit may use only one inverter of may not use the inverter (as illustrated in FIG. 2). An area of the ESD protection circuit may be reduced. Correspondingly, a production cost may be reduced and economic efficiency may be improved.

In the present disclosure, when the ESD happens, the substrate terminal S1 of the MOS transistor 25 may be triggered to be high voltage, to turn on the MOS transistor 25 and form parasitic current to discharge the ESD current.

Figure 8:
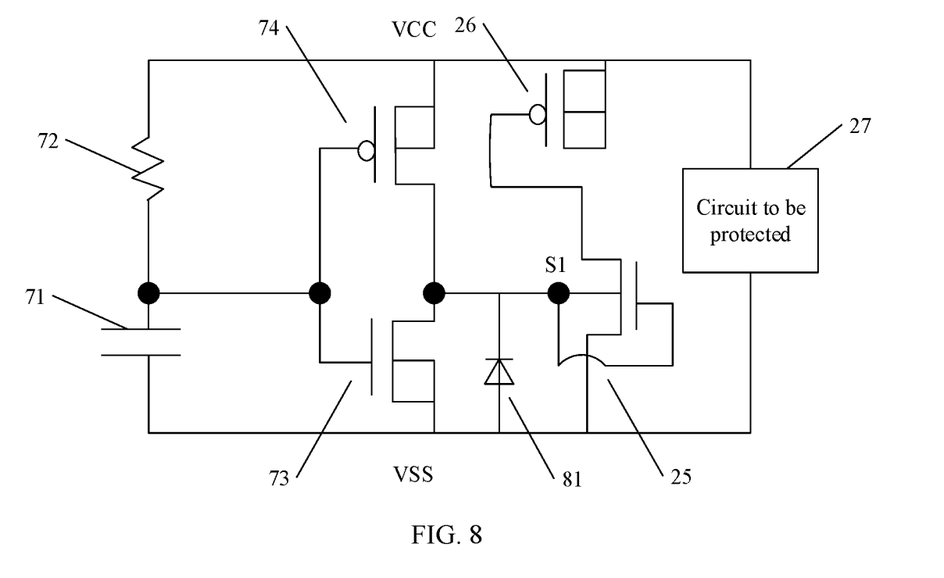
FIG. 8 illustrates another ESD protection circuit consistent with various embodiments of the present disclosure.

Another embodiment of the present disclosure also provides another ESD protection circuit illustrated in FIG. 8. The ESD protection circuit may further include a diode 81. A first terminal of the diode 81 may be connected between the second terminal of the last inverter and the substrate terminal S1 of the MOS transistor 25. A second terminal of the diode 81 may be connected to the ground terminal.

For description purposes only, the embodiment illustrated in FIG. 8 where the ESD protection circuit includes one inverter is used as an example to illustrate the present disclosure, and should not limit the scopes of the present disclosure. As illustrated in FIG. 8, the inverter may include the P-type transistor 74 and the N-type transistor 73. Correspondingly, the second terminal of the last inverter may be a node between the P-type transistor 74 and the N-type transistor 73.

In the present disclosure, the ESD protection circuit may further include the diode 81. Correspondingly, the MOS transistor 25 may also be turned on when the reverse ESD happens, to form the parasitic current to reversely discharge the ESD current and protect the core device.

The present disclosure also provides an electronic device. The electronic device may include an ESD protection circuit as illustrated in FIGS. 2-8 and a semiconductor device to be protected. A first terminal of the semiconductor device to be protected may be connected to a power source terminal, and a second terminal of the semiconductor device to be protected may be connected to a ground terminal.

A terminal of the ESD protection circuit and a terminal of the semiconductor device to be protected may be connected to the power source terminal. Another terminal of the ESD protection circuit and another terminal of the semiconductor device to be protected may be connected to the ground terminal.

In the present disclosure, the ESD protection circuit may include: a power source terminal, a ground terminal, and a discharge path. The discharge path may include a clamp transistor and a MOS transistor connected in series. The clamp transistor and the MOS transistor may be integrated in a same semiconductor substrate and have different types. For the clamp transistor, a source electrode and a drain electrode may be electrically connected to a substrate terminal, and to the power source terminal. For the MOS transistor, a gate may be electrically connected to the substrate terminal. For the MOS transistor, a first electrode may be one of the source electrode and the drain electrode, while a second electrode may be another one of the source electrode and the drain electrode. The first electrode of the MOS transistor may be electrically connected to a gate of the clamp transistor, and the second electrode of the MOS transistor may be electrically connected to the ground terminal. When ESD occurs, the MOS transistor may be turned on, parasitic current may be formed between the substrate terminal of the clamp transistor and the second electrode of the MOS transistor. In an ESD protection circuit formed by current technologies, a source electrode and a drain electrode of a clamp transistor are connected to VCC and VSS respectively, so the leakage current occurs easily. Instead, in the present disclosure, the ESD protection circuit may include the clamp transistor, and the source electrode, the drain electrode, and the substrate terminal of the clamp transistor may be electrically connected, and may form a capacitor structure with the gate. Correspondingly, when ESD does not happen, a leakage current in the discharge path and influence on the performance of the core device may be avoided effectively. The clamp transistor and the MOS transistor connected in series may form a silicon-controlled-rectifier structure. When ESD occurs, the MOS transistor may be turned on, and the parasitic current may be formed between the substrate terminal of the clamp transistor and the second electrode of the MOS transistor. Correspondingly, ESD current may be discharged and the core device may be protected.

The ESD protection circuit may further include a first capacitor and a first resistor. When the ESD happens, the first capacitor and the first resistor may trigger the substrate terminal of the MOS transistor to be high voltage, to turn on the MOS transistor and form parasitic current to discharge the ESD current.

The ESD protection circuit may further include a second capacitor, a second resistor, and one or more inverters connected in series. When the ESD happens, the substrate terminal of the MOS transistor may be triggered to be high voltage, to turn on the MOS transistor and form parasitic current to discharge the ESD current.

In the ESD protection circuit, the gate structures of the plurality of clamp transistors and the gate structures of the plurality of MOS transistors may be disposed on the surface of the semiconductor substrate alternately, to improve heat dissipation of the plurality of clamp transistors and the plurality of MOS transistors. A heat dissipation uniformity may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. An electrostatic discharge protection circuit, comprising a power source terminal, a ground terminal, and a discharge path, wherein:
   the discharge path includes a clamp transistor and a MOS transistor connected in series;
   the clamp transistor and the MOS transistor are integrated into a same semiconductor substrate, and have different types;
   for the MOS transistor, a gate electrode is electrically connected to a substrate terminal;
   for the MOS transistor, a first electrode is one of a source electrode and a drain electrode, and a second electrode is another one of the source electrode and the drain electrode;
   for the MOS transistor, the first electrode is electrically connected to a gate electrode of the clamp transistor, and the second electrode is electrically connected to the ground terminal; and
   when an electrostatic discharge occurs, the MOS transistor is turned on to form parasitic current between a substrate terminal of the clamp transistor and the second electrode of the MOS transistor.

2. The circuit according to claim 1, wherein:
   the clamp transistor is a PMOS transistor and the MOS transistor is an NMOS transistor.

3. The circuit according to claim 2, further including a first capacitor and a first resistor, wherein:
   a first terminal of the first capacitor is electrically connected to the power source terminal;
   a first terminal of the first resistor is electrically connected to a second terminal of the first capacitor, and a second terminal of the first resistor is electrically connected to the ground terminal;
   a second terminal of the first capacitor is electrically connected to the substrate terminal of the MOS transistor; and
   when the electrostatic discharge occurs, the first resistor and the first capacitor trigger the substrate terminal of the MOS transistor to have a high voltage, to turn on the MOS transistor.

4. The circuit according to claim 3, further including a diode, wherein:

a first terminal of the diode is electrically connected to the substrate terminal, and a second terminal of the diode is electrically connected to the ground terminal.

5. The circuit according to claim 3, wherein:
the first resistor is one of a non-silicide poly resistor, a gate soft tie high NMOS resistor, a gate soft tie low PMOS resistor, a metal parasitic resistor, or a high-resistance resistor.

6. The circuit according to claim 2, further including a second resistor, a second capacitor, and one or more inverters connected in series, wherein:
a first terminal of the second resistor is electrically connected to the power source terminal;
a first terminal of the second capacitor is electrically connected to a second terminal of the second resistor, and a second terminal of the second capacitor is electrically connected to the ground terminal;
an input terminal of a first inverter among the one or more inverters is electrically connected between the second resistor and the second capacitor, and an output terminal of a last inverter among the one or more inverters is electrically connected to the substrate terminal of the MOS transistor;
when the electrostatic discharge occurs, the second resistor, the second capacitor, and the one or more inverters trigger the substrate terminal of the MOS transistor to have a high voltage, to turn on the MOS transistor; and
a number of the one or more inverters is singular.

7. The circuit according to claim 6, wherein each inverter of the one or more inverters includes a P-type transistor and an N-type transistor, wherein:
a gate electrode of the P-type transistor is electrically connected to a gate electrode of the N-type transistor;
a source electrode of the P-type transistor is electrically connected to the power source terminal;
a source electrode of the N-type transistor is electrically connected to the ground terminal;
a drain electrode of the N-type transistor is electrically connected to a drain electrode of the P-type transistor;
a first terminal of the inverter is located between the gate electrode of the P-type transistor and the gate electrode of the N-type transistor; and
a second terminal of the inverter is located between the drain electrode of the P-type transistor and the drain electrode of the N-type transistor.

8. The circuit according to claim 6, further including a diode, wherein:
a first terminal of the diode is electrically connected between a second terminal of the last inverter among the one or more inverters and the substrate terminal of the MOS transistor; and
a second terminal of the diode is electrically connected to the ground terminal.

9. The circuit according to claim 1, wherein:
the electrostatic discharge protection circuit protects a fin field-effect transistor (FinFET).

10. The circuit according to claim 1, wherein:
a gate structure of the clamp transistor and a gate structure of the MOS transistor are disposed on a surface of the semiconductor substrate alternately.

11. An electronic device, including an electrostatic discharge protection circuit and a semiconductor device to be protected, wherein:
the electrostatic discharge protection circuit includes a power source terminal, a ground terminal, and a discharge path, wherein:
the discharge path includes a clamp transistor and a MOS transistor connected in series;
the clamp transistor and the MOS transistor are integrated into a same semiconductor substrate, and have different types;
for the MOS transistor, a gate electrode is electrically connected to a substrate terminal;
for the MOS transistor, a first electrode is one of a source electrode and a drain electrode, and a second electrode is another one of the source electrode and the drain electrode;
for the MOS transistor, the first electrode is electrically connected to a gate electrode of the clamp transistor, and the second electrode is electrically connected to the ground terminal; and
when an electrostatic discharge occurs, the MOS transistor is turned on to form parasitic current between a substrate terminal of the clamp transistor and the second electrode of the MOS transistor;
and
a first terminal of the semiconductor device to be protected is electrically connected to the power source terminal, and a second terminal of the semiconductor device to be protected is electrically connected to the ground terminal.

* * * * *